United States Patent
Maldonado et al.

(10) Patent No.: US 10,587,329 B2
(45) Date of Patent: Mar. 10, 2020

(54) TRANSMIT ANTENNA DIVERSITY IN RADIO FRONT END ARCHITECTURES

(71) Applicant: QUALCOMM Incorporated, San Diego, CA (US)

(72) Inventors: David Maldonado, San Diego, CA (US); Andrew Puayhoe See, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,954

(22) Filed: Sep. 21, 2018

(65) Prior Publication Data

US 2019/0097715 A1 Mar. 28, 2019

Related U.S. Application Data

(60) Provisional application No. 62/562,303, filed on Sep. 22, 2017.

(51) Int. Cl.
*H01Q 1/24* (2006.01)
*H04B 7/08* (2006.01)
(Continued)

(52) U.S. Cl.
CPC ........... *H04B 7/0814* (2013.01); *H03F 3/189* (2013.01); *H03F 3/24* (2013.01); *H04B 1/006* (2013.01);
(Continued)

(58) Field of Classification Search
USPC .................. 375/299, 347, 267; 455/101, 133
See application file for complete search history.

(56) References Cited

U.S. PATENT DOCUMENTS 5,507,035 A * 4/1996 Bantz ................... H04B 7/0814
375/299
8,934,850 B1 1/2015 Wu et al.
(Continued)

FOREIGN PATENT DOCUMENTS

GB 2538887 A 11/2016

OTHER PUBLICATIONS

International Search Report and Written Opinion—PCT/US2018/052319—ISA/EPO—dated Dec. 20, 2018.

*Primary Examiner* — Eva Y Puente
(74) *Attorney, Agent, or Firm* — Loza & Loza, LLP/Qualcomm

(57) ABSTRACT

Disclosed aspects relate to methods and apparatus for controlling a wireless device having at least one radio frequency (RF) system. The methods and apparatus are configured to select an antenna for transmission of signals from radio components of the at least one RF system from between a first default antenna normally coupled to the radio components of the at least one RF system for transmission of signals and one of a plurality of other antennas in the wireless device. Further, switching is configured to couple the radio components to one of the other plurality of antennas selected as the antenna for transmission cycles when the radio components are transmitting in an antenna switch diversity (ASDIV) period. Additionally, the methods and apparatus are configured to operate a switch to couple the radio components back to at least the first default antenna during receiving cycles during the ASDIV period.

26 Claims, 12 Drawing Sheets

(51) Int. Cl.
  *H03F 3/24* (2006.01)
  *H04B 7/06* (2006.01)
  *H04B 1/00* (2006.01)
  *H03F 3/189* (2006.01)
  *H04B 1/44* (2006.01)
  *H04L 5/14* (2006.01)
  *H04B 7/0404* (2017.01)
  *H01Q 21/28* (2006.01)

(52) U.S. Cl.
  CPC ............ *H04B 1/44* (2013.01); *H04B 7/0602* (2013.01); *H04B 7/0811* (2013.01); *H04L 5/14* (2013.01); *H01Q 1/243* (2013.01); *H01Q 21/28* (2013.01); *H03F 2200/294* (2013.01); *H04B 7/0404* (2013.01)

(56) References Cited

U.S. PATENT DOCUMENTS

| | | | |
|---|---|---|---|
| 2004/0082299 A1* | 4/2004 | Brunner | H01Q 1/246 455/101 |
| 2006/0121937 A1 | 6/2006 | Son et al. | |
| 2007/0223615 A1 | 9/2007 | Dosanjh et al. | |
| 2008/0181174 A1* | 7/2008 | Cho | H04B 7/0857 370/329 |
| 2012/0178502 A1* | 7/2012 | Teo | H04B 7/061 455/562.1 |
| 2014/0162574 A1 | 6/2014 | Rousu et al. | |
| 2016/0036512 A1* | 2/2016 | Rick | H04B 1/006 375/267 |
| 2016/0127007 A1 | 5/2016 | Wang et al. | |
| 2016/0365908 A1* | 12/2016 | Chang | H04B 7/0602 |
| 2017/0111074 A1* | 4/2017 | King | H04B 1/40 |
| 2017/0201358 A1* | 7/2017 | Li | H04B 17/318 |
| 2018/0262257 A1* | 9/2018 | Greene | H04B 7/0404 |

* cited by examiner

| Case 1 (1Tx/1Rx) | Best Antenna | | | | ASDIV Switches | |
|---|---|---|---|---|---|---|
| | Bottom | | Top | | SW1 | SW2 |
| | Antenna 1 | Antenna 4 | Antenna 3 | Antenna 2 | | |
| Case 1 (a) | Tx | | | | Default | Default |
| | Rx1 | | | | Default | Default |
| Case 1 (b) | Tx | | | | Default | Default |
| | | Rx2 | | | Default | Default |
| Case 1 (c) | Tx | | | | Default | Default |
| | | | Rx3 | | Default | Default |
| Case 1 (d) | Tx | | | | Default | Default |
| | | | | Rx4 | Default | Default |
| Case 1 ASDIV (a) | | | Tx | | ASDIV | ASDIV |
| | | | Rx3 | | Default | Default |
| Case 1 ASDIV (b) | | Rx2 | Tx | | ASDIV | ASDIV |
| Case 1 ASDIV (c) | | | Tx | Rx4 | ASDIV | ASDIV |
| | | | | | Default | Default |

FIG. 4

| Case 2 (1Tx/2Rx) | Best Antenna | | | | ASDIV Switches | |
|---|---|---|---|---|---|---|
| | Bottom | | Top | | SW1 | SW2 |
| | Antenna 1 | Antenna 4 | Antenna 3 | Antenna 2 | | |
| Case 2 (a) | Tx | | | | Default | Default |
| | Rx1 | Rx2 | | | Default | Default |
| Case 2 (b) | Tx | | | | Default | Default |
| | Rx1 | | Rx3 | | Default | Default |
| Case 2 (c) | Tx | | | | Default | Default |
| | Rx1 | | | Rx4 | Default | Default |
| Case 2 ASDIV(a) | | | Tx | | ASDIV | ASDIV |
| | | Rx2 | Rx3 | | Default | Default |
| Case 2 ASDIV(b) | | | Tx | | ASDIV | ASDIV |
| | Rx1 | | Rx3 | | Default | Default |
| Case 2 ASDIV(c) | | | Tx | | ASDIV | ASDIV |
| | | | Rx3 | Rx4 | Default | Default |

| Case 3 (1Tx/4Rx) | Best Antenna | | | | ASDIV Switches | |
| --- | --- | --- | --- | --- | --- | --- |
| | Bottom | | Top | | | |
| | Antenna 1 | Antenna 4 | Antenna 3 | Antenna 2 | SW1 | SW2 |
| Case 3 (a) | Tx | | | | | |
| | Rx1 | Rx2 | Rx3 | Rx4 | Default | Default |
| | | | Tx | | Default | Default |
| Case 3 (b) | Rx1 | Rx2 | Rx3 | Rx4 | ASDIV | ASDIV |
| | | | | | Default | Default |

TRANSMIT ANTENNA DIVERSITY IN RADIO FRONT END ARCHITECTURES

PRIORITY CLAIM

This application claims priority to and the benefit of U.S. Provisional Patent Application No. 62/562,303 filed in the U.S. Patent and Trademark Office on Sep. 22, 2017, the entire content of which is incorporated herein by reference as if fully set forth below in its entirety and for all applicable purposes.

BACKGROUND

Field

The subject matter disclosed herein relates to control of wireless devices, and more particularly to methods and apparatus for controlling two or more radio systems operating concurrently in particular Radio Frequency Front End (RFFE) architectures.

Background

Increasingly, wireless devices implement various wireless technologies coexistent in the same wireless device where multiple radios may operate concurrently in the same or close radio frequency (RF) bands. As one example of concurrent technologies, the 3rd Generation Partnership Project (3GPP) as part of Long Term Evolution (LTE) has adopted Licensed-Assisted Access or Licensed Anchor Assisted (LAA) technology that utilizes carrier aggregation in the downlink to combine LTE in unlicensed spectrum (e.g., LAA or LTE-U) (e.g., 5 GHz band) along with LTE in the licensed band as a persistent anchor channel.

In more recent developments, wireless devices may have the ability to also concurrently support two or more Time Division Duplexed (TDD) systems. For example, a wireless device may support concurrent operation of a Wireless Local Area Network (WLAN) system such as WiFi and Ultra-high-Band (UHB) systems with a Wide Area Network (WAN) system such as LAA or LTE-U concurrently active in the same RF band (e.g., the unlicensed 5 GHz band). Furthermore, 5G NR bands, such as n77, n78, and n79 will utilize TDD. A need exists for controlling the radio frequency concurrency of the different radio systems while providing savings in Front End components when providing antenna diversity for the radios.

SUMMARY

According to an aspect, the present disclosure provides a method for controlling a wireless device having at least one radio frequency (RF) system. In particular, the method includes selecting an antenna for transmission of signals from radio components of the at least one RF system from between a first default antenna that is normally coupled to the radio components of the at least one RF system for transmission of signals and one of a plurality of other antennas in the wireless device. Additionally, the disclosed method includes configuring one or more switches in the device to couple the radio components to the selected antenna for transmission cycles of the at least one RF system when the radio components are transmitting in an antenna switch diversity (ASDIV) period. Furthermore, the method includes configuring the one or more switches to couple the radio components to at least the first default antenna for receive cycles of the at least one RF system during the ASDIV period.

In another aspect, a wireless device having at least one radio frequency (RF) system is disclosed. The device includes a default antenna normally coupled to radio components of the at least one RF system for transmission and reception of signals and a plurality of other antennas. Furthermore, the device includes one or more switches configured to couple the radio components to one of the plurality of other antennas during transmission cycles when the radio components are transmitting in an antenna switch diversity (ASDIV) period and to couple the radio components back to at least the default antenna during receiving cycles.

According to yet another aspect of the present disclosure, an apparatus operable with at least one RF radio system is disclosed. The wireless device includes means for selecting an antenna for transmission of signals from radio components of the at least one RF system from between a first default antenna that is normally coupled to the radio components of the at least one RF system for transmission of signals and one of a plurality of other antennas in the wireless device. Additionally, the wireless device includes means for configuring one or more switches in the device to couple the radio components to the selected antenna for transmission cycles of the at least one RF system when the radio components are transmitting in an antenna switch diversity (ASDIV) period. Moreover, the device includes means for configuring the one or more switches to couple the radio components to at least the first default antenna for receive cycles of the at least one RF system during the ASDIV period.

According to still another aspect, a non-transitory computer-readable medium storing computer-executable code is disclosed. The computer-executable code comprises code for causing a computer to select an antenna for transmission of signals from radio components of the at least one RF system from between a first default antenna that is normally coupled to the radio components of the at least one RF system for transmission of signals and one of a plurality of other antennas in the wireless device. The medium further includes code for causing a computer to configure one or more switches in the device to couple the radio components to the selected antenna for transmission cycles of the at least one RF system when the radio components are transmitting in an antenna switch diversity (ASDIV) period. Also, the medium includes code for causing a computer to configure the one or more switches to couple the radio components to at least the first default antenna for receive cycles of the at least one RF system during the ASDIV period

BRIEF DESCRIPTION OF THE DRAWINGS

FIG. 4 is a table illustrating different configurations and operations for the apparatus illustrated in FIG. 2.

FIG. 5 is a table illustrating different configurations and operations for the apparatus illustrated in FIG. 2.

DETAILED DESCRIPTION

Figure 1:
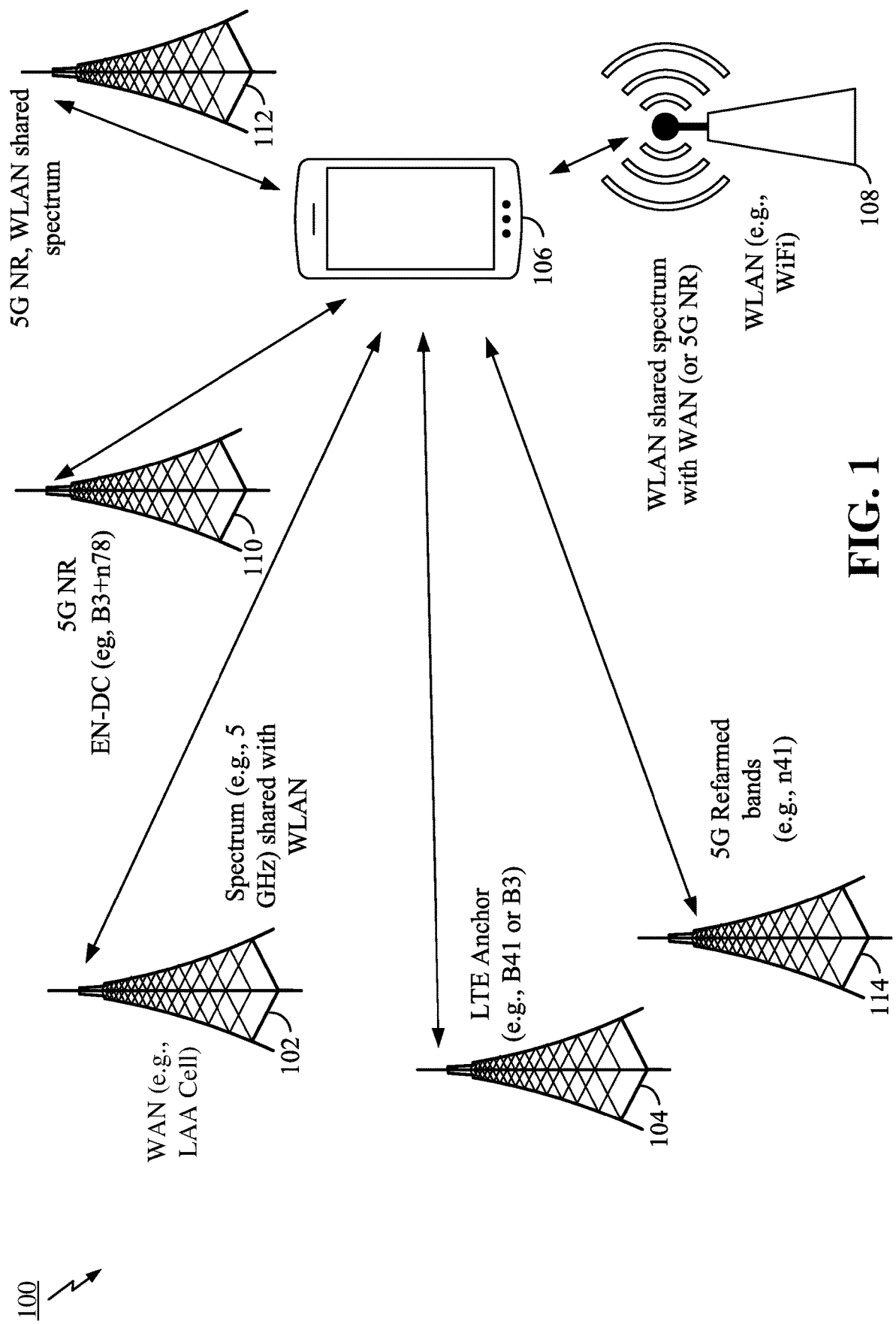
FIG. 1 is a diagram illustrating an exemplary wireless environment in which embodiments of the invention may be practiced.

Aspects of the present invention are disclosed in the following description and related drawings directed to specific embodiments of the invention. Alternate embodiments may be devised without departing from the scope of the invention. Additionally, well known elements of the invention may not be described in detail or may be omitted so as not to obscure the relevant details of the invention.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device (e.g., a server or device). It will be recognized that various actions described herein can be performed by specific circuits (e.g., application specific integrated circuits, transceiver and processing circuitry (e.g., modem processors)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Certain embodiments described herein are directed to wireless devices which employ MIMO technology that utilizes multiple antennas for transmission of signals. MIMO systems may further be implemented along with what are termed as antenna switch diversity (ASDIV) systems that allow RF components in different radio frequency front end (RFFE) systems of different radio systems in a wireless device to be selectively switched or coupled with different antennas. These embodiments may control radio frequency concurrency of different (e.g., TDD) radio systems and antenna switch diversity, while providing savings in Front End components when providing antenna diversity for the radios.

For example, the present disclosure provides methods and apparatus for controlling antenna switch diversity in wireless devices with TDD radio systems. More specifically, the methods and apparatus utilize a combination of hardware and software (or firmware) configured to provide efficient and/or optimal utilization of the various antennas in a wireless device, as well as reduce the number of transmission lines within a wireless device needed for routing signals when using antenna switch diversity (ASDIV). As will be described herein, the disclosed methods and apparatus are configured to determine when to use selective ASDIV switching during transmit cycles based on one or more criteria related to a transmit antenna as well as the number of antennas used for transmit and receive (e.g., whether or not MIMO or High Order Receive diversity (HO RxD) is being used). The present methods and apparatus may also reduce the number of transmission lines needed to route signals to particular selected antennas during ASDIV through specific switch configurations for switches utilized for implementing ASDIV.

The various concepts presented throughout this disclosure may be implemented across a broad variety of telecommunication systems, network architectures, and communication standards. FIG. 1, as an illustrative example without limitation, illustrates an exemplary radio access network 100 in which the present methods and apparatus may be implemented. The network 100 may include a WAN base station, such as an LAA base station, access point (AP), or node 102 that transmits or receives on a shared spectrum, such as the 5 GHz band shared with other technologies such as Ultrahigh-bandwidth (UHB), WiFi 5 GHz, 5G NR bands, or even refarmed bands such as n41. While base station 102 is illustrated as an LAA base station in FIG. 1, it is noted that the disclosure is not necessarily limited to such, but may include other technologies that are operable concurrent with another technology using a shared spectrum for transmit and receive.

Additionally, network 100 may include a WAN base station 104, such as an LTE base station or eNode B 104 that provides an anchor frequency or bandwidth with which the transmissions to and from the LAA cell 102 could be aggregated. These carriers are used for communication with a wireless device 106, such as a mobile station or User Equipment (UE). For LAA systems, the wireless device 108 may both receive and transmit using an LAA radio within device 106 using a shared spectrum.

Network 100 further includes a WLAN access point (AP) 108 that uses the shared spectrum utilized by base station 102. In the example of FIG. 1, the AP 108 is a WiFi AP or node using the 5 GHz spectrum, but is not limited to such. In various implementations, the air interface in the radio access network 100 may utilize various combinations of licensed spectrum, unlicensed spectrum, or shared spectrum.

Yet further, in an aspect network 100 may include other technologies that could be time division duplexed (TDD), such as include 5G New Radio (NR) illustrated by base station or gNB 110 that may communicate with the wireless device 106 using E-UTRA NR dual connectivity (i.e., EN-DC, and specifically bands B3+n78). In other aspects, the network might include 5G NR, WLAN shown by base station 112 that shares spectrum in a TDD manner with other wireless technologies.

In general, it is noted for purposes of this application that a base station (BS) serves as a cell. Broadly, a base station is a network element in a radio access network responsible for radio transmission and reception in one or more cells to or from a wireless device or User Equipment (UE), such as UE 106. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), or some other suitable terminology.

The radio access network 100 is illustrated supporting wireless communication for wireless device or UE 106. In the present application, the terms wireless device or UE may be referred to as a mobile apparatus, a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present disclosure, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles (e.g., eLAA/C-V2X in Bands 46/47), aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

The device 106 may also include one or more wireless local area network (WLAN) and wide area network (WAN) transceiver(s) that may be connected to one or more antennas. The wide area network transceiver(s) comprises suitable devices, hardware, and/or software for communicating with and/or detecting signals to/from other wireless devices within a network. In one aspect, the wide area network transceiver may be operable under 5G New Radio (NR), LTE, LTE Advanced, LTE-U, LAA, eLAA, MulteFire™, WCDMA, UMTS, 4G, or GSM, as examples. Additionally, any other type of wireless networking technologies may be used, for example, WiMax (802.16), Ultra-wideband, ZigBee, wireless USB, etc. The mobile device may communicate wirelessly with a plurality of wireless APs using RF signals (e.g., 2.4 GHz, 3.6 GHz, and 4.9/5.0 GHz bands) and standardized protocols for the modulation of the RF signals and the exchanging of information packets. Additionally, the WLAN transceiver(s) may be operable under any of a number of wireless technologies including WiFi (e.g., various specifications under IEEE 802.11) and Bluetooth.

Figure 2:
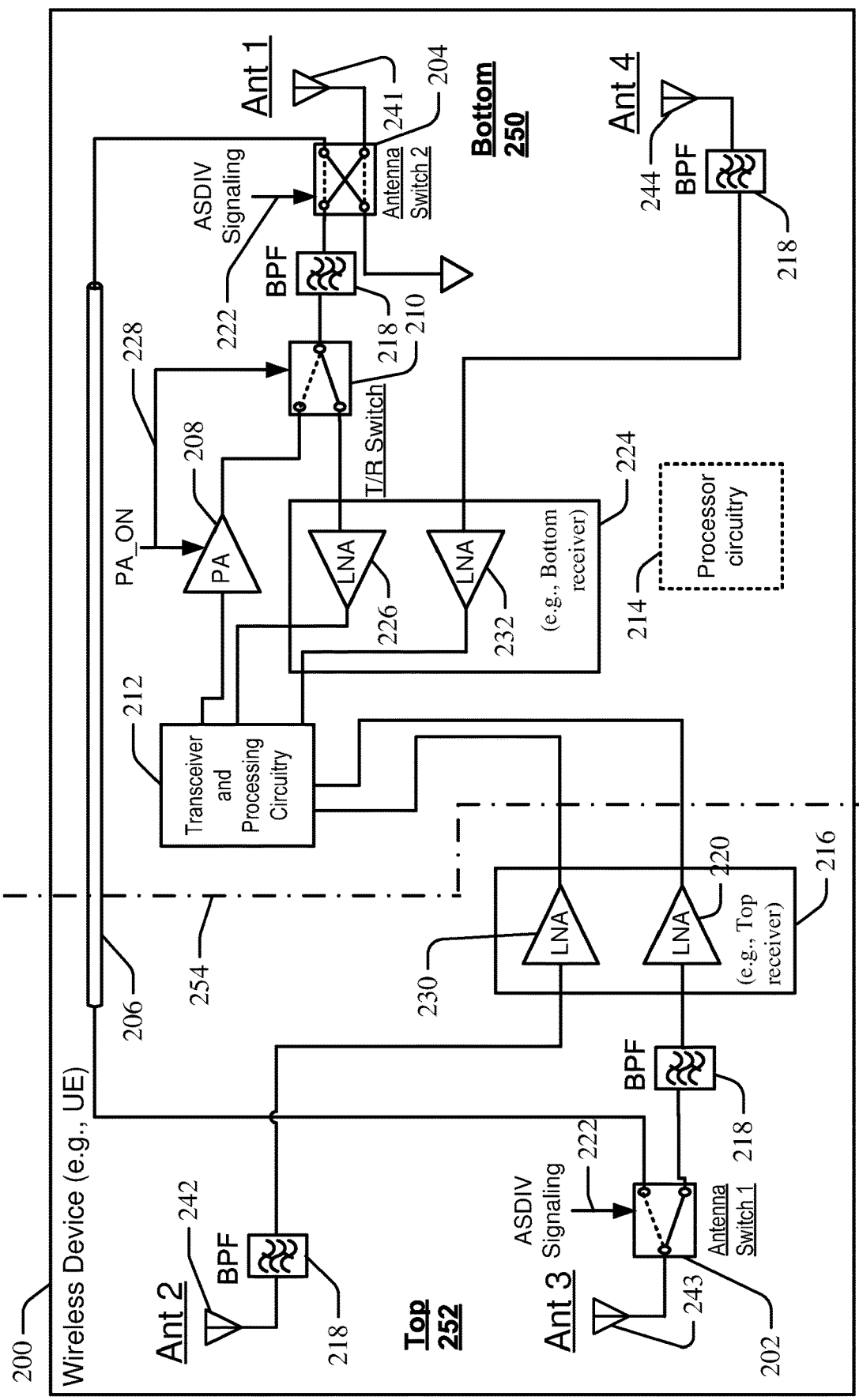
FIG. 2 illustrates an exemplary apparatus that may be employed in a wireless device for implementing antenna switch diversity (ASDIV).

FIG. 2 is an exemplary apparatus 200 illustrating an antenna switch diversity scheme that may be employed in a wireless device, such as device 106 in FIG. 1. The exemplary apparatus 200 is shown with four antennas (antennas Ant 1 through Ant 4 respectively denoted by reference numbers 241, 242, 243, and 244) that are coupled to various receiving and transmitting components (e.g., power amplifiers (PAs) and low noise amplifier (LNAs)). The four antennas may be used when implementing up to 4×4 MIMO architectures, but other operations/architectures are also implemented with the apparatus 200. In the illustrated apparatus, which may represent a mobile wireless device, the antennas may be located at different locations within the wireless device to provide antenna separation (e.g., 20 dB antenna separation). In the illustrated example, Ant 1 241 and Ant 4 244 are located at a bottom portion 250 of the wireless device, whereas Ant 2 242 and Ant 3 243 are located at a top portion 252 of the wireless device, which may be approximately divided as shown by line 254, which is merely an aid to visualize some division between top and bottom portions and is not intended as an actual division or to show any exact location. These top and bottom locations are merely exemplary, and those skilled in the art will appreciate that "top" and "bottom" are relative terms, and that designs may feature antennas located at various different locations in a device where the distances between the antennas relative to one another in the wireless device are designed to afford a desired antenna separation. Additionally, line 254 shown in FIGS. 7, 9, and 12 herein is used to illustrate the approximate division between top and bottom portions.

Apparatus 200, as illustrated, includes an arrangement where Ant 1 241 and Ant 3 243 are coupled to antenna switches 202 and 204 with a transmission line or trace 206. Switches 202 and 204, in this particular example, are used to implement antenna switch diversity whereby the antennas Ant 1 241 and Ant 3 243 may be selectively switched to couple a transmit PA 208 via a further transmit/receive (T/R) switch 210 to either Ant 1 241 or Ant 3 243 dependent upon which antenna is determined by processing circuitry to be the best antenna for signal transmission. The processing circuitry for determining the best antenna for signal transmission may be any of a number of various processing circuitry within the wireless device including a transceiver and processing circuitry 212 or some other processing circuitry shown represented by processor circuitry 214. Those skilled in the art will also appreciate that the antenna switch diversity using antennas Ant 1 241 and Ant 3 243 is merely exemplary, and the concepts disclosed herein are applicable across a number of different antenna switch diversity schemes and architectures. Additionally, a number of different methodologies for determining the antenna(s) to use may be utilized with the presently disclosed methods and apparatus. For example, a UE may determine which antenna is better for transmit based on a received signal strength. In another example, a network assisted method may be used where the UE is configured to receive a control or information signal from at least one base station, where the control or information signal indicates which transmitted signal from the various UE antennas is best received by at least one base station according to one or more of any number of different metrics. Furthermore, due to the development of sound reference signaling (SRS), a UE may use this technology to determine an optimal antenna. In SRS, a UE transmits sounding signals to the base stations where the BS first sends training signals to the UE to, in turn, send back to the BS. This process may then be used to determine which UE antenna to use for transmitting.

Antenna switch 202, in addition to being coupled to antenna Ant 3 243 and transmission line 206, is coupled with front end components 216 for at least receiving signals according to a particular radio technology (or multiple radio technologies if the antenna is used to transmit and receive signals across various technologies and frequencies, including Ultra-high-band (UHB), WiFi, 5G NR, and LAA, as examples). In one example, the components 216 may be a top receiver configured for receiving signals from top located antennas (e.g., antennas Ant 2 242 and Ant 3 243). As illustrated, the coupling of the switch 202 to the front end components may further include band pass filtering (BPF) 218 for passing particular frequencies, such a UHB frequencies or WiFi frequencies, as examples. In the illustrated example, the switch 202 may include a default position where antenna Ant 3 243 is coupled to the front end components 216, and, in particular, an LNA 220 of the front end receiver components 216. As will be explained in more detail later, antenna switch 202 is operated through an input signal 222 (e.g., an "ASDIV signal") where the switch 202 may be selectively coupled to the transmission line 206 (and ultimately the PA 208 via switch 204) or the front end components 216.

It is noted that the default position of the antenna switch 202 establishes a default antenna that is the antenna coupled because of the switch position selected via the input signal 222. It is noted that in certain aspects, the default antenna may be determined based on a particular radio technology being determined as a default technology to be utilized first by a UE device during transmit or receive. In other aspects, the default antenna may be determined dynamically, such that the antenna having the lowest SINR could be selected as the default. In still other aspects, the default antenna may be selected based on whatever antenna within the UE is closest to a transmitter or receive based on the internal circuitry layout of the UE device (e.g., the antenna having the smallest conductor trace distance to the receive/transmit circuitry). Additionally in yet other aspects, the default antenna selection may be time based where an antenna that will be used to transmit the majority of the time would be the default antenna.

Antenna switch 204, in addition to being coupled to Ant 1 241 and transmission line 206, is coupleable via T/R switch 210 with either PA 208 for transmit or other front end receiver components 224 including an LNA 226 as an exemplary apparatus for receiving signals according to one or more particular radio technologies including UHB, WiFi, 5G NR, or LAA, as examples. In an aspect, the front end receiver components 224 may be a "bottom receiver", which is the receiver configured for receiving signals from bottom located antennas (e.g., antennas Ant 1 241 and Ant 4 244). As illustrated, the coupling of switch 202 to the T/R switch 210 may further include band pass filtering (BPF) 218 for passing particular frequencies, such as UHB frequencies or WiFi frequencies, as examples. In the illustrated example, switch 204 may include a default position where Ant 1 241 is coupled via T/R switch 210 to the either PA 208 for transmit cycles or LNA 226 for receive cycles. During ASDIV operation by the application or change of ASDIV signaling 222, however, the state of switch 204 is changed to couple the T/R switch 210 to the transmission line 206 (which may include a coaxial cable), and ultimately to Ant 3 243 through concurrent operation of switch 202. In the illustrated embodiment, if switch 204 is a double pole, double throw (DPDT) switch, Ant 1 241 is coupled to ground, typically through a resistance (not shown). It is noted that, in an aspect, the T/R switch 210 may be operable with a power amplifier on signal 228 (e.g., PA_ON). Thus, when processing circuitry (e.g., transceiver and processing circuitry 212 or other circuitry 214) determines that a transmit cycle is to be effectuated, the processing circuitry issues or causes issuance of signal 228 to turn on PA 208 and select the transmission path for switch 210.

The example of FIG. 2 further illustrates that Ant 2 242 and Ant 4 244 may be respectively coupled with an LNA 230 in front end receiver components 216 and an LNA 234 in front end receiver components 224 for receiving signals of various technologies including UHB or WiFi, as examples. The couplings may further include BPF 218 for passing a band of RF frequencies according to various technologies employed. While Ant 2 and Ant 4 are illustrated as only configured for receiving signals, those skilled in the art will appreciate that the apparatus 200 is not necessarily limited to such, and other architectures may employ further antenna switching and/or T/R switching such that these antennas might be used for signal transmission as well.

Figure 3:
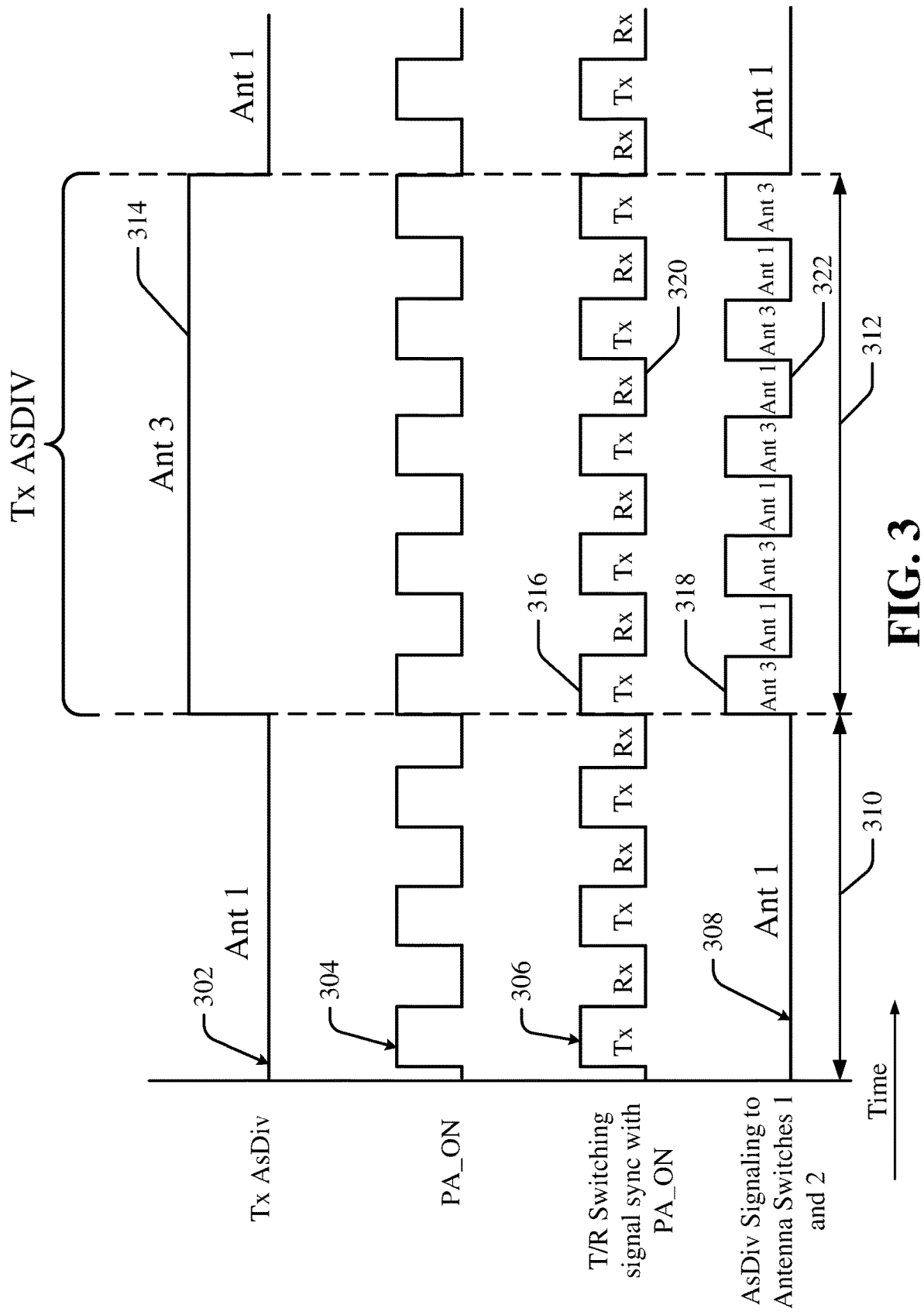
FIG. 3 illustrates an exemplary state/signal timeline for various signals in the apparatus of FIG. 2.

Turning to FIG. 3, this diagram illustrates an exemplary timeline of the various operations that may occur in the apparatus 200 in FIG. 2 when implementing ASDIV. As shown, the timeline illustrates four representative signals or states; the Tx ASDIV state timeline 302 (i.e., whether ASDIV is currently employed), the PA_ON signal state timeline 304 (i.e., on or off, 0 or 1, etc.), the T/R switch state timeline 306 (e.g., the state of T/R switch 210 being either transmit or receive), and the timeline 308 showing the state of the antenna switches 202 and 204 (i.e., whether antenna Ant 1 or antenna Ant 3 is coupled to the T/R switch 210 or, in other words, are switches 202 and 204 in their default states coupling antenna Ant 1 to switch 210 or in ASDIV states coupling antenna Ant 3 to switch 210 for transmission cycles).

Timelines 302 and 308 illustrate that during a first time period 310 the processing circuitry has selected antenna Ant 1, for example based on one of the criteria described above, for transmitting signals from PA 208 and antenna switches 202 and 204 will be in their default states. As may then be seen from timelines 304 and 306, during transmit cycles (i.e., signal PA_ON is in a "high" or "ON" state), the T/R switch 210 is synchronized to the cycle states of the PA_ON signal and the switch 210 is switched between transmit (Tx) and receive (Rx) states where signal transmission occurs in one cycle and signal reception occurs in a next cycle with the Tx/Rx cycles oscillating to perform transmit and receive in a TDD fashion.

When a processing circuitry determines that antenna Ant 3 is the optimal or best antenna for signal transmission in a second time period 312, timeline 302 shows that an ASDIV operation has been selected to provide at least transmission via antenna Ant 3. As may be seen at cycle 316 in timeline 306, the PA 208 is turned on and the T/R/ switch 210 will be in a transmit state. Concurrently the ASDIV switching of antenna switches 202 and 204 will be in states that couple antenna Ant 3 to the PA 208 for transmission as indicated at 318 in timeline 308.

During a next receive cycle shown at 320 and 322 in timelines 306 and 308, respectively, the T/R switch 210 and the antenna switches 202 and 204 will be switched to couple the receive components (e.g., LNA 226) to antenna Ant 1 during the receive cycles while ASDIV operation is occurring (i.e., during time period 312). As may be seen in timeline 308, this switching alternates between antennas Ant 3 and Ant 1 for transmit and receive cycles during the time period in which ASDIV operation is selected. In systems utilizing 4×4 MIMO receiving, for example, it is noted that the switches 202 and 204 in the example of FIG. 2 are returned to their default states to ensure that all of the antennas Ant 1 through Ant 4 are coupled to receiving circuitry during the receive cycles. In a particular aspect, it is noted that in the case of one transmit antenna and one receive antenna, for example, the ASDIV switches may be maintained in the ASDIV state during both transmit and receive cycles. For example, antenna 3 could be coupled to PA 208 during transmit, but antennas Ant 2 or 4, for example, would be unaffected by the state of the ASDIV switches and could be selected by software, firmware, or other logic to receive signals via LNA 230 or LNA 232.

Once antenna Ant 3 is no longer determined to be the optimal or best antenna or, alternatively, after some predetermined time period or condition, ASDIV operation is terminated and the controlling processing circuitry returns switches 202 and 204 to their default settings. It is noted here that during the receive cycles, one or more of the antennas Ant 1 through Ant 4 from the example of FIG. 2 may be utilized for reception of signals depending on whether MIMO is utilized or not, as will be further discussed below.

It is noted there that ASDIV, as disclosed herein, is applicable in time division duplex (TDD) scenarios where antennas are switched in time between two or more technologies transmitting or receiving signals on shared frequencies, but is not necessarily limited to such. In further aspects, a UE may be configured to make a determination of when to enter ASDIV operation, such as a determination that TDD bands are being utilized by the UE. Alternatively, the decision to enter ASDIV operation may be triggered by an external signaling received from a base station, for example.

Figure 6:
FIG. 6 is a table illustrating different configurations and operations for the apparatus illustrated in FIG. 2.

FIGS. 4-6 show tables illustrating different configurations and operations for the apparatus illustrated in FIG. 2. In particular, FIG. 4 illustrates a case where one antenna of the four illustrated antennas is used for transmitting signals and one antenna of the four illustrated antennas is used for receiving signals. FIG. 5 illustrates another case where one antenna is used for transmitting signals, whereas two antennas are used for receiving signals in a MIMO arrangement. Finally, FIG. 6 illustrates a case where one antenna is used for transmitting signals, and all four antennas are used for receiving signals in a 4×4 MIMO arrangement.

Concerning FIG. 4, this table first illustrates that for four different cases (i.e., Cases 1(a) through 1(d)) where antenna Ant 1 is determined to the best antenna for signal transmission, such as from PA 208, although not limited to this particular PA in other implementations. In each case a different antenna may be utilized as the receive antenna, whether in a top portion of the wireless device for this particular example (e.g., antennas Ant 2 or Ant 3) or a bottom portion of the wireless device in this example (e.g., antennas Ant 1 and Ant 4). For all of these cases 1(a)-1(d), the ASDIV switches 202 and 204 (shown as SW1 and SW2 in the table of FIG. 4) will be in their default settings where antenna Ant 1 will be coupleable to PA 208. For each of cases 1(a)-1(d) respective receiver components are coupled to respective antennas of antennas Ant 1 through Ant 4. Dependent upon processing circuitry, such as transceiver and processing circuitry 212 or other circuitry 214, the particular receiver in the receiver components and antenna used for receiving is selected.

When a best or optimal antenna for transmit is determined by processing circuitry (e.g., 212 or 214) to be antenna Ant 3, for example, then at least three further cases are illustrated in FIG. 4; i.e., Case 1 ASDIV (a)-Case 1 ASDIV(c) with respective antennas Ant 3, Ant 4, and Ant 2 receiving signal during receive cycles. Although not shown in FIG. 4, it is noted that because the ASDIV switches are normally returned to their default states, there could also be a case where Antenna 1 is configured to receive signals during receive cycles. In the illustrated cases the ASDIV switches 202 and 204 are placed into their ASDIV states such that antenna Ant 3 may be coupled to PA 208 during transmit cycles. As disclosed before, during the receive cycles, the switches 202 and 204 may be returned to their default settings as further illustrated in the table of FIG. 4. Of further note, if antenna Ant 3 is determined to be the best antenna by the processing circuitry, then the use of antenna Ant 3 may be the best antenna to engender the best receive performance. Accordingly Case 1 ASDIV(a) would provide the best receive performance (during which cycles the switches 202 and 204 would be returned to their default states to couple antenna Ant 3 to LNA 220, for example).

FIG. 5 illustrates a table showing states and connections when apparatus 200 uses a single antenna for transmit cycles and two antennas during receive cycles (2×2 Rx). For this example, since there are four total antennas with which to make combinations with two of these four antennas for receiving, there would be a total of six possible receive antenna combinations. Thus, FIG. 5 illustrates Cases 2(a)-2(f) for the six possible antenna receive configurations where antenna Ant 1 is determined to the best antenna for signal transmission, such as from PA 208, although not limited to this particular PA in other implementations. For all of these cases 2(a)-2(f), the ASDIV switches 202 and 204 (shown as SW1 and SW2 in the table of FIG. 4) will be in their default settings where antenna Ant 1 will be coupleable to PA 208. For each of cases 1(a)-1(d) respective receiver components are coupled to respective antennas of antennas Ant 1 through Ant 4. Dependent upon processing circuitry, such as transceiver and processing circuitry 212 or other circuitry 214, the particular receiver in the receiver components and antenna used for receiving is selected.

When a best or optimal antenna for transmit is determined by processing circuitry (e.g., 212 or 214) to be antenna Ant 3, for example, then at least six further cases are illustrated in FIG. 5; i.e., Case 2 ASDIV (a)-Case 2 ASDIV(f). In these cases the ASDIV switches 202 and 204 are placed into their ASDIV states such that antenna Ant 3 may be coupled to PA 208 during transmit cycles. As disclosed before, the switches 202 and 204 may be returned to their default settings during the receive cycles as further illustrated in the table of FIG. 5.

FIG. 6 illustrates a table showing an exemplary operation of the apparatus 200 when employing ASDIV and four antennas for receiving (i.e., 4×4 MIMO receiving). Since all four antennas Ant 1-Ant 4 are used for receiving, only two cases 3(a) and 3(b) are extant. In case 3(a), antenna Ant 1 is determined to be the best antenna for signal transmission, and thus the switches 202 and 204 are in their default states for both the transmit and receive cycles. For case 3(b), if antenna Ant 3 is determined to be the best antenna for transmission, then during the transmit cycles the switches 202 and 204 are placed in their ASDIV states to couple antenna Ant 3 to PA 208, whereas during the receive cycles, the switches are returned to their default states to couple antenna Ant 3 to the receiver LNA 220 to ensure 4×4 MIMO reception for the apparatus of FIG. 2.

Figure 7:
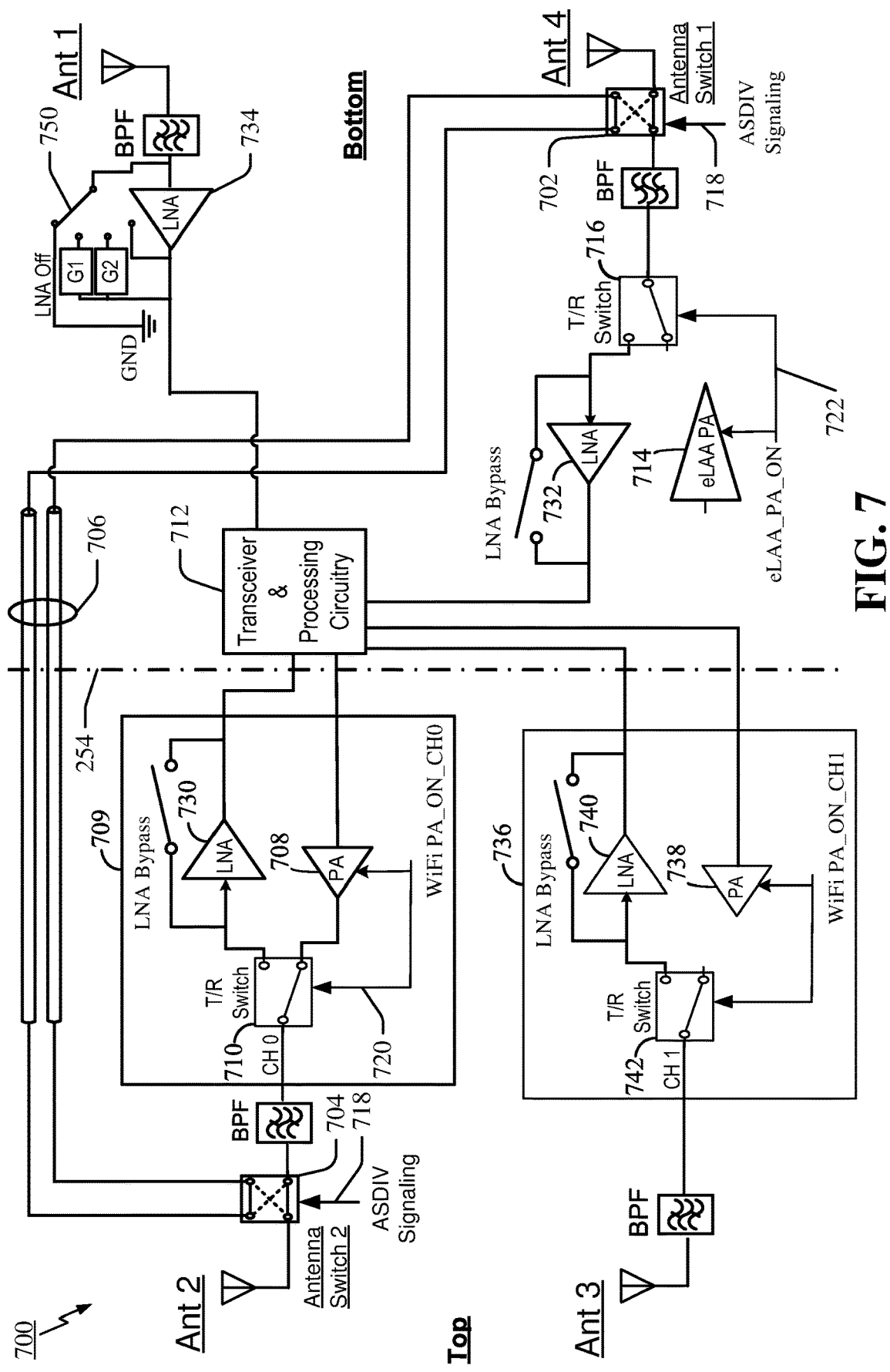
FIG. 7 illustrates another exemplary apparatus that may be employed in a wireless device for implementing ASDIV.

FIG. 7 illustrates an exemplary block diagram of an apparatus 700 of another implementation of an ASDIV scheme for use in a wireless device such as device 106 in FIG. 1. In particular, apparatus may include concurrent radio systems utilizing similar bands or bandwidth where the radio systems operate according to TDD. In the illustrated example, the radio technologies may include WiFi and LAA/eLAA, but this is merely exemplary.

As illustrated, apparatus 700 is shown with four antennas (antennas Ant 1 through Ant 4) that are coupled to various receiving and transmitting components (e.g., PAs and LNAs) for WiFi or LAA/eLAA systems. The four antennas may be used when implementing up to 4×4 MIMO architectures, but other operations/architectures are also implementable within the apparatus 700, such as 2×2 receive. In illustrated apparatus 700, which may represent a mobile wireless device, the antennas may be located at different locations within the wireless device to provide antenna separation (e.g., 20 dB antenna separation). In the illustrated example, Ant 1 and Ant 4 are located at a bottom portion of the wireless device, whereas Ant 2 and Ant 3 are located at a top portion of the wireless device. These locations are merely exemplary, and those skilled in the art will appreciate that "top" and "bottom" are relative terms, and that designs may feature antennas located at various different locations in a device where the distances between the antennas relative to one another in the wireless device are designed to afford a desired antenna separation.

Apparatus 700, as illustrated, includes an arrangement where antennas Ant 2 and Ant 4 are coupled to antenna switches 702 and 704, with at least two transmission lines, coaxial cables, or traces 706 coupling the two switches 702 and 704, which are both implemented with double pole/double throw (DPDT) switches. Switches 702 and 704 are used to implement antenna switch diversity (ASDIV) whereby the antennas Ant 2 and Ant 4 may be selectively switched to couple with at least one WiFi/5 Ghz transmit PA 708 in a WiFi front end module (FEM) 709 (in this case a WiFi Channel 0 FEM) via a further transmit/receive (T/R) switch 710 to either Ant 2 or Ant 4 dependent upon which antenna is determined by a transceiver and processing circuitry 712 to be the best antenna for signal transmission. Similarly, the antenna diversity switches 702 and 704 serve to selectively couple an eLAA PA 714 to either antenna Ant 4 or antenna Ant 2 via a T/R switch 716.

The processing circuitry 712 (or similar circuitry) may issue or cause to issue an ASDIV signal 718 used to change the states of the antennas switches 702 and 704. Additionally, the processing circuitry 712 for determining the best antenna for signal transmission may be any of a number of various processing circuitry within a wireless device including a transceiver and processing circuitry, wireless modem, or some other processing circuitry. Those skilled in the art will also appreciate that the antenna switch diversity using antennas Ant 2 and Ant 4 is merely exemplary, and the concepts disclosed herein are applicable across a number of different antenna switch diversity schemes and architectures.

As illustrated, the default positions or states of the antenna switches 702 and 704 are to couple T/R switch 710 to antenna Ant 2 and T/R switch 716 to antenna Ant 4, whereas during ASDIV operation with application or change of signal 718, T/R switch 710 is coupled to antenna Ant 4 and T/R switch 716 is coupled to antenna Ant 2 via transmission lines or traces 706, which extend between the top and bottom portions of the device or apparatus 700. It is also noted that the physical layout of apparatus 700 is typically configured such that the T/R switch 710 and associated WiFi PA 708 (and FEM 709) will be located in a same region or portion of the wireless device (e.g., at the top portion of the device as shown in the example of FIG. 7) as antenna Ant 2. Similarly, the T/R switch 716 and associated eLAA PA 714 will be located in a same region or portion of the wireless device (e.g., at the bottom portion of the device as shown in the example of FIG. 7) as antenna Ant 4. Such proximity reduces the trace distance through which RF signals have to travel, thus reducing losses and interference. As will be appreciated by those skilled in the art, during ASDIV operation, the traces 706 will transmit RF signals to be transmitted (or received), and the increased distance and number of traces will increase the likelihood of loss and interference in these signals. Accordingly, in an aspect, the processing circuitry 712 or other circuitry may be configured to try to maximize the use of the default positions of switches 702 and 704 to reduce losses and interference that may be engendered due to use of lines or traces 706.

Further illustrated in FIG. 7 are front end receiver components such as LNA 730 in WiFi Channel 0 FEM 709 or LNA 732 associated with eLAA PA 714, which may be used to receive LAA signals via antenna 4, for example. Additionally, antennas Ant 1 and Ant 3 in the illustrated example are not shown coupled to the ASDIV switches 702 and 704 (although the invention is not limited to such). Antenna Ant 1 may be coupled to an LNA 736, which may receive various signals such as LAA, UHB, 5G NR, or even WiFi 5 GHz as examples. Moreover, antenna Ant 3 may be coupled to another WiFi Channel FEM 736 (e.g., WiFi Channel 1 FEM) including a transmit PA 738, a receive LNA 740 and a T/R switch 742 to switch between receiving and transmitting.

Each of the WiFi PA 708 and the eLAA PA 714 may be turned on with a PA ON signal; WiFi_PA_ON_CH0 signal 720 and eLAA_ON signal 722 respectively. The PA on signals 720 and 722 may be issued or caused to issue with processing circuitry 712 or some other circuitry or logic within the wireless device. Of further note, each of the T/R switches 710, 716, and 742 may be synchronized with the respective PA on signals (e.g., 702 or 722) to ensure that when the PA on signal is issued, the T/R switch state will be selected for transmit.

Figure 8:
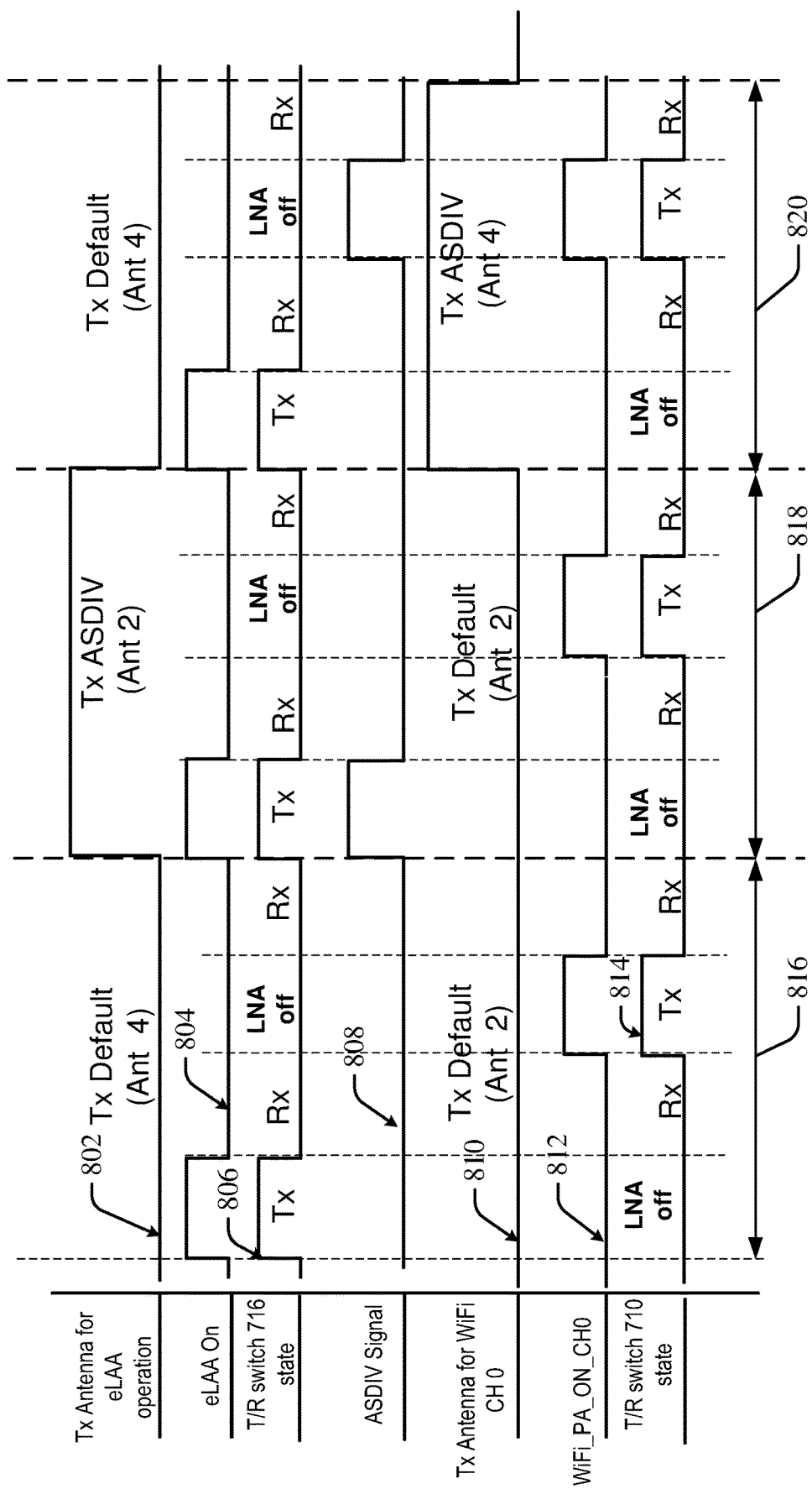
FIG. 8 illustrates an exemplary state/signal timeline for various signals in the apparatus of FIG. 7.

FIG. 8 illustrates signal/state timelines for various signals or states occurring during operation of the apparatus 700 in FIG. 7 to better understand the operation of this apparatus. In this particular example, concurrency between eLAA and WiFi systems using MIMO receiving is illustrated. Notwithstanding, the timing diagram of FIG. 8 is not limited to such and may relate to various different systems, or a UE containing at least two different radio systems.

The top timeline 802 illustrates the transmit antenna for eLAA operation; i.e., the antenna coupled to eLAA PA 714 via switch 716, timeline 804 illustrates the eLAA on signal, and timeline 806 illustrates the state of or the signal to the T/R switch 716 for eLAA transmit or receive selection, which is synchronized with timeline 804 (i.e., the eLAA_PA_ON signal).

Timeline 808 illustrates the operation of the ASDIV switches 702 and 704 when a processing circuitry or logic determines that another antenna of ASDIV antennas Ant 2 or Ant 4 is the better antenna for eLAA transmissions as well as WiFi 5 Ghz transmissions for Channel 0. Timeline 810 illustrates the transmit antenna for the concurrent WiFi radio system; i.e., the antenna coupled to WiFi Channel 0 PA 708 via T/R switch 710, timeline 812 illustrates the WiFi PA on signal for WiFi Channel 0, and timeline 814 illustrates the state of or the signal to the T/R switch 710 for WiFi Channel 0 transmit or receive selection, which is synchronized with timeline 812 (i.e., the WiFi_PA_ON_CH0 signal).

During a first time period 816 the default transmit antennas Ant 4 and Ant 2 for the respective eLAA PA 714 and the WiFi PA 708 are selected as may be seen in timelines 802 and 810, as well as timeline 808 showing that the ASDIV signal 718 is selecting the default (e.g., the signal is not asserted). During a first portion of time period 816, the eLAA PA 714 is turned on and the eLAA transmitter transmits. Concurrently, in order to protect receiver components in the WiFi FEM 709 that operate in the same band, an LNA off condition (e.g., shorting a LNA to ground, disconnecting the LNA, or disabling the LNA in order to avoid damage to the LNA) or, alternatively, an LNA bypass (See LNA bypass of LNA 730 in FIG. 7) is effectuated to protect the receiver components from the eLAA transmission by PA 714. As will be appreciated by those skilled in the art, LAA/eLAA is a Time Division Duplex system so the eLAA transceiver transmits signals at a first time separate from a second time for receiving signals as may be seen in timeline 806. During receiving by the LAA system (e.g., LNA 732 receiving LAA signals via Ant 4 and T/R switch 716), the WiFi system may also receive signals via its default antenna Ant 2, as concurrent reception of signals does not pose a threat for damaging front end components. This reception is indicated in the second sub time segment of time period 816.

Further during time period 816, which illustrates one particular scenario, the WiFi PA may next transmit via default antenna Ant 2 as may be seen in timelines 812 and 814 where the WiFi_PA_ON_CH0 signal is asserted turning on PA 708. Concurrently, the LAA system may effectuate an LNA off or LNA bypass condition or other isolation to protect at least LNA 732 from the WiFi Channel transmissions in the same band. After WiFi transmission, then both the LAA and WiFi systems may concurrently receive signals via their default antennas Ant 4 and Ant 2, respectively.

In a next time period 818, which illustrates anther particular scenario, it is assumed that processing circuitry determines that the best antenna for transmission of both the eLAA transmitter will be the other antenna (i.e., antenna Ant 2), and that the best antennas WiFi transmitter will be also be antenna Ant 2 (e.g., a top antenna), which happens to be its default transmit antenna. During this time period 818, during eLAA transmission, the ASDIV signal 718 is asserted for switching the states of switches 702 and 704, thus coupling the eLAA PA 714 to antenna Ant 2 via T/R switch 716 and transmission lines or traces 706. Concurrently, the LNA off or LNA bypass of LNA 730 may be selected to protect this receiver from the eLAA transmissions.

At a next portion of time period 818, the ASDIV switches 702 and 704 are returned to their default positions so that the LNA receiver 732 for LAA transmissions and LNA 730 for WiFi Channel 0 transmissions may receive signals via their respective default antennas. Next, since antenna Ant 2 is the best antenna and is also the default antenna for WiFi transmissions, the PA 708 transmits WiFi Channel 0 transmissions via antenna Ant 2. Concurrently, LNA 732 is bypassed to protect against damage from the WiFi transmissions in an aspect. Finally in time period 818, both the WiFi LNA 730 and the LAAL NA 732 receive signals via their respective default antennas.

Finally at a time period 820, it is assumed during this time period that the best antenna for transmission of the WiFi signals is antenna Ant 4. Thus, during WiFi transmission, the ASDIV signal 718 will cause the switches 702 and 708 to change states to couple antenna 4 to the WiFi PA 708 via T/R switch 710 and transmission lines or traces 706.

Figure 9:
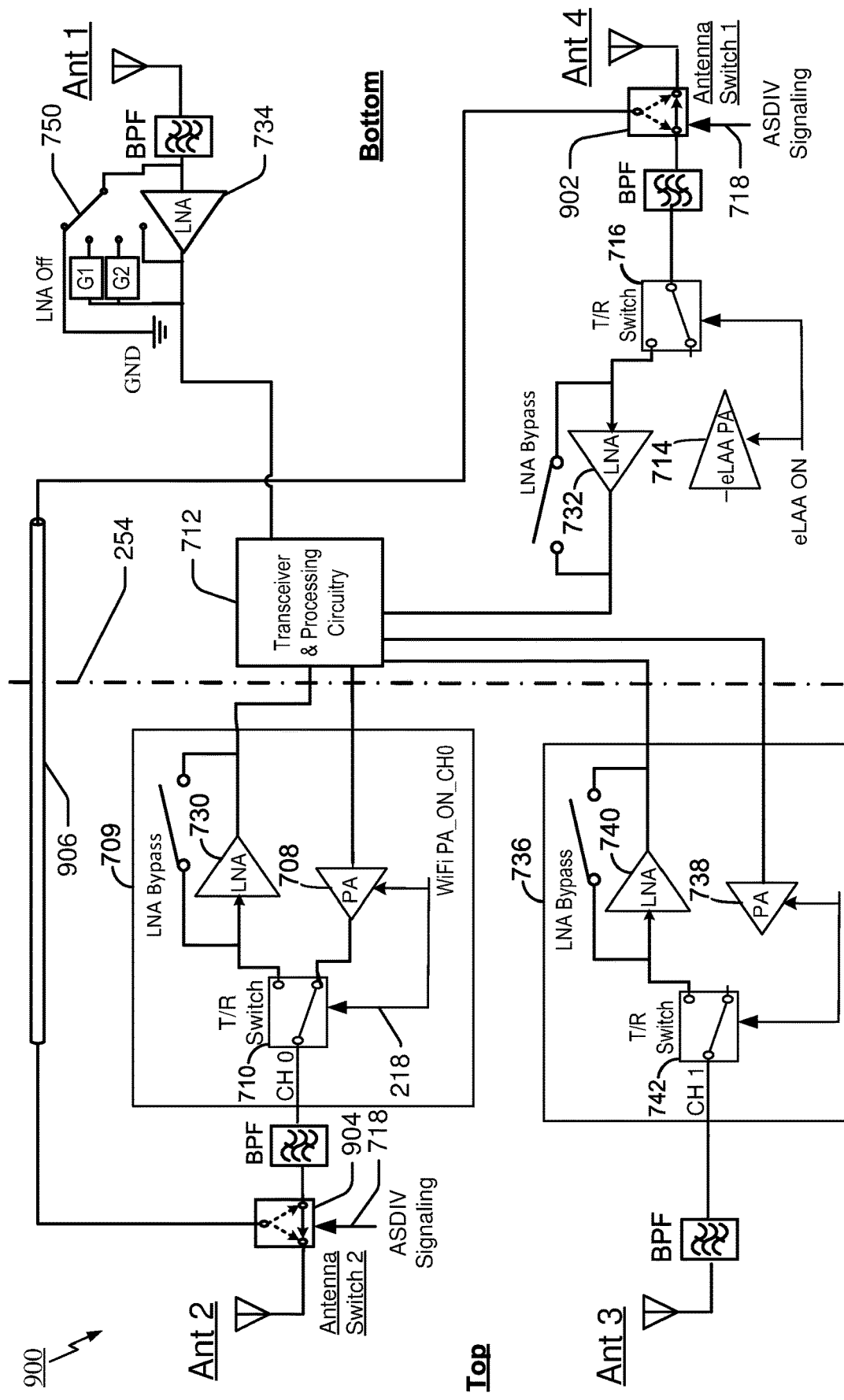
FIG. 9 illustrates yet another exemplary apparatus that may be employed in a wireless device for implementing ASDIV with a hardware structure for reducing a number of transmission lines for ASDIV.

As mentioned before, it is desirable to minimize the usage of the ASDIV transmission lines (e.g., lines 706) to, in turn, minimize transmission loses and interference. Accordingly, FIG. 9 illustrates yet another exemplary apparatus 900 employing "delta" (or equivalent) switches 902 and 904 having three distinct states selecting particular two of three terminals of the switch rather than the DPDT switches 702 and 704 as shown in the example of FIG. 7. With such switching, only a single transmission line or trace 906 is needed to accomplish ASDIV switching, thus increasing the likelihood of reduced losses and interference for the RF signals transmitted thereby.

Figure 10:
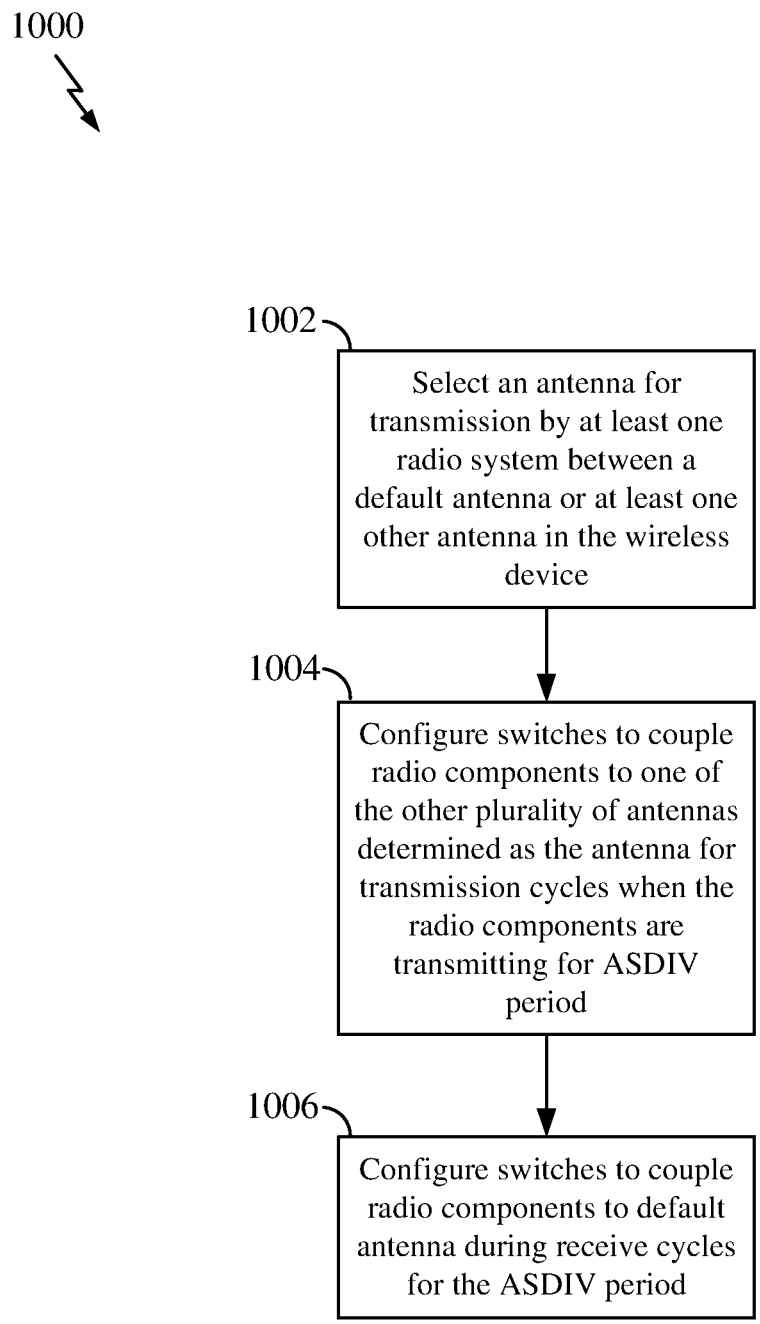
FIG. 10 illustrates a flow diagram of an exemplary method for controlling radio frequency concurrency in a wireless device.

FIG. 10 illustrates a flow diagram of an exemplary method 1000 for controlling a wireless device having at least one radio frequency (RF) system, such as the devices illustrated in FIG. 2, 7, 9, or 12. In particular, method 1000 is a method for controlling the timing and selection of ASDIV switching for either at least one radio system such as was illustrated in FIG. 2, or in a system with concurrent radio systems, such as was illustrated in FIGS. 7 and 9. Method 1000 may include first selecting an antenna (e.g., a best or optimal antenna as described previously) for at least transmission by at least one RF system in a wireless device as shown in block 1002. Selecting the antenna for transmission of signals further comprises a selection between a first default antenna that is normally coupled to the radio components of the at least one RF system for transmission of signals and one of a plurality of other antennas in the wireless device.

For example, in the system of FIG. 2 the determination of the optimal antenna for transmission by PA 208 is between antennas Ant 1 and Ant 3, where antenna Ant 1 was the default transmitting antenna in system 200. In another example, as exemplified by the systems of FIGS. 7 and 9, the determination of the optimal antenna for transmission by at least two radio systems (e.g., WiFi and LAA systems, and PAs 708 and 714, in particular) is made between antennas Ant 2 and Ant 4 in those systems, where antenna Ant 4 is the default transmitting antenna for an eLAA PA 714 and antenna Ant 2 is the default transmitting antenna for a WiFi PA 708. In other aspects, it is conceivable that three or more antennas could be available for transmission by one or more PA's with the use of a plurality of ASDIV switches. In an aspect, the determination of the optimal or best antenna is performed by processing circuitry such as circuitry 212, 214, 712, or equivalents thereof including dedicated logic.

When the antenna is determined to be an antenna other than the default antenna, block 1004 illustrates that one or more switches in the device may be configured to couple the radio components to the selected antenna for transmission cycles of the at least one RF system when the radio components are transmitting in an antenna switch diversity (ASDIV) period (e.g., 312 or 818 in FIGS. 3 and 8, respectively). The processes of block 1004 may further include switching time based switching, such as was illustrated in FIGS. 3 and 8, wherein the ASDIV switches couple transmit components (i.e., PAs) to the optimal antennas during transmit cycles and return coupling of the antennas to their default couplings during receive cycles. Additionally, the processes in block '1004 may include switching one radio system PA to an optimal antenna during ASDIV operation, but returning the ASDIV switching to default settings when another radio system PA is transmitting as was illustrated in the timelines of FIG. 8. The processes of block 1004 may be effectuated by processing circuitry such as circuitry 212, 214, 712, or equivalents thereof including dedicated logic, in combination with ASDIV switches such as switches 202, 204, 702, 704, 902 and 904.

Method 1000 further includes configuring the one or more switches to couple the radio components to at least the first default antenna for receive cycles of the at least one RF system during the ASDIV period as shown in block 1006. As described above, the switching of the ASDIV switches to default settings during receive cycles that alternate in time with transmit cycles. Thus, those skilled in the art will appreciate that portions of process 1004 and process 1006, in part, occur alternately as may be seen from FIGS. 3 and 8, such as during periods 312, 818, or 820, for example. It is noted that the processes of block 1006 may be effectuated by processing circuitry such as circuitry 212, 214, 712, or equivalents thereof including dedicated logic, in combination with ASDIV switches such as switches 202, 204, 702, 704, 902 and 904.

According to a further aspect of method 1000, the one or more switches may further be configured to couple the radio components in the wireless device to respective default antennas after a predetermined time or condition for providing antenna switch diversity has ended. For example, as the processing circuitry controlling the ASDIV switching may further include logic or software instructions causing the processing circuitry to ensure minimal ASDIV switching to minimize the time that RF signals are transmitted via ASDIV transmission lines or traces such as traces 206, 706 or 906.

In yet other aspects of the present disclosure, the transceiver and processing circuitry (e.g., 212 or 712) may include logic or software instructions implementing methodology that may be part of method 1000, where such methodology includes modifying the operation receive components or the transmit components in the radio system to at least one of protect the receive components or reduce interference presented by transmit components of one radio system upon another radio system in the wireless device. As an example, timelines 806 and 814 in FIG. 8, the LNAs of either WiFi receive components or LAA receive components may bypassed when a PA of the other radio system is transmitting. In other aspects, an LNA component of a radio system may be one of bypassed, disconnected, disabled (e.g., turned off through some signaling or turning off power to the component), or the attenuation gain reduced as may be seen in the circuitry of LNA 734 in FIG. 7 showing a switch 750 or similar device that may select between a plurality of selective attenuation of gains of the LNA (e.g., gains G1 and G2 as illustrated in FIG. 7) or a short or bypass to ground (GND) coupling or a bypass of the LNA 734. It is noted that this construction illustrated by switch 750 is merely exemplary and that, in certain aspects, any of a number of various methods or apparatus may be used to electrically isolate the LNA 734 from potentially damaging signals (or any of the LNAs illustrated herein). That is, the present methods and apparatus employ the protection of LNAs and other components through isolation, whether that isolation be implemented through turning off components in the case of shorting the input of an LNA to ground as illustrated or by configuring T/R switches to isolate the components from signals received from the antennas (e.g., configure switch 742 to ensure LNA 740 is not coupled to antenna Ant 3).

It is noted that in the method 1000, at least one of the radio systems is operable with a Wide Area Network (WAN) according to one of LTE-U technology, LTE, Licensed Assist Access (LAA) technology, enhanced LAA (eLAA) technology, or 5G New Radio (NR) technology. Additionally, another radio system is operable with a Wireless Local Area Network (WLAN) according to WiFi technology. Of further note, method 1000 is applicable to two or more radio systems concurrently operable in a wireless device where the radio systems are asynchronous, and the provided processing circuitry may be further configured to provide the benefit of protection of components even though the radios may not be synchronized or even aware of the transmit/receive of the other radio(s).

According to another aspect, it is noted that the present apparatus and methods may further be adapted to apply to transmitting Sounding Reference Signals (SRS) from the UE devices illustrated in FIG. 2, 7, 9, 11, or 12 to a base station or an eNodeB. It is noted that SRS signals are physical signals using a known sequence, transmitted in an uplink (UL) from the UE to an eNodeB to enable the eNodeB to estimate Channel State Information (CSI) and UL channel quality over a range of frequencies. In particular, the ASDIV techniques disclosed herein are compatible with supporting SRS transmission and the techniques herein may be applied to transmitting SRS signal. In particular aspects, one or more antennas (e.g., Ant 1-Ant4) may be switched to transmit SRS.

Figure 11:
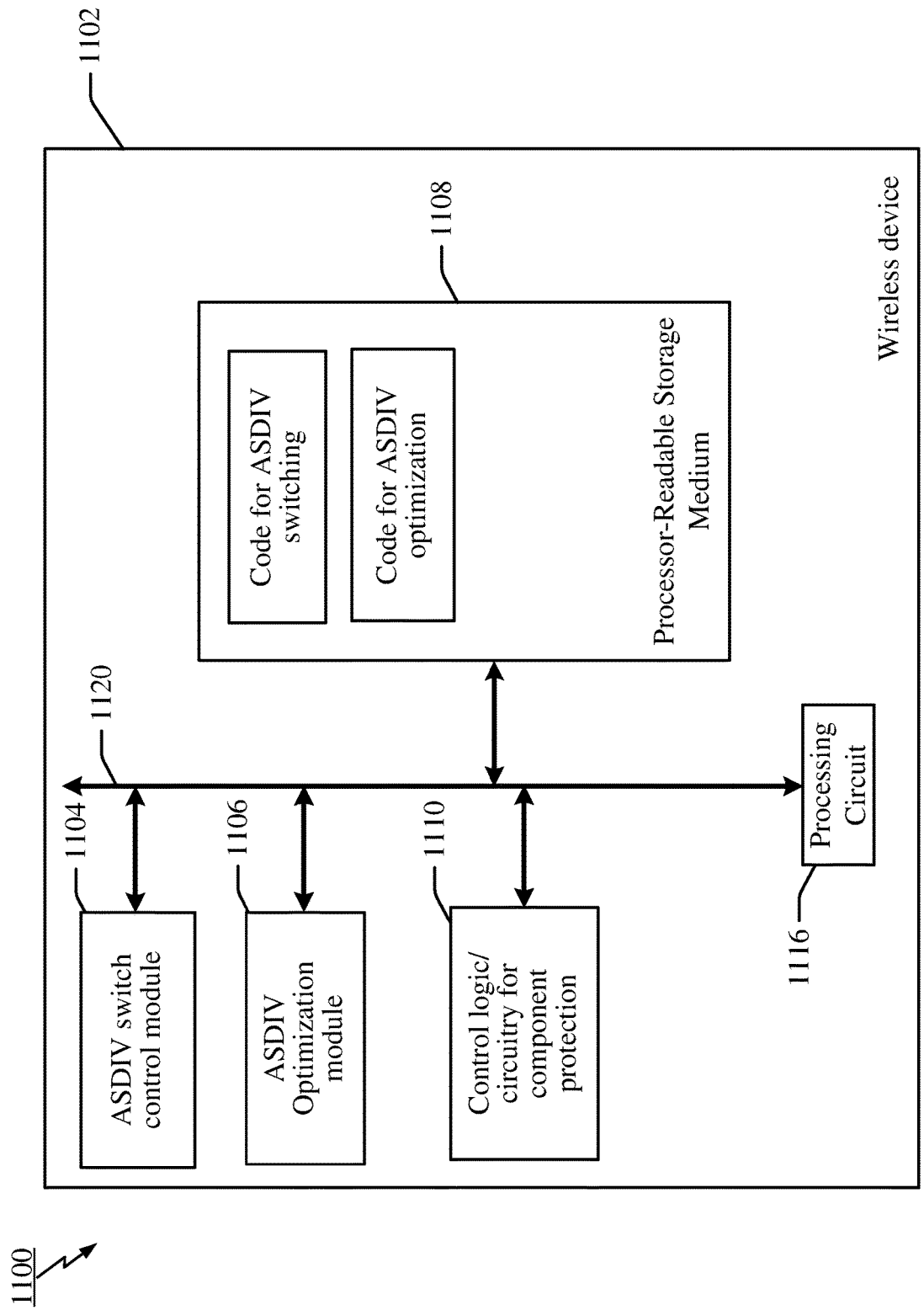
FIG. 11 illustrates a diagram showing a simplified example of a hardware implementation for a wireless device that provides control of ASDIV switching and control of at least front end components of one or more radio systems within the wireless device.

FIG. 11 illustrates a diagram showing a simplified example of a hardware implementation for a wireless device apparatus 1102 that provides control of ASDIV switching and control of at least front end components of one or more radio systems within the wireless device. Device 1102 typically has a controller or processor 1116 that may include one or more microprocessors, microcontrollers, digital signal processors, sequencers and/or state machines. The device 1102 may be implemented with a bus architecture, represented generally by the bus 1120. The bus 1120 may include any number of interconnecting buses and bridges depending on the specific application of the processing circuit 1116 and the overall design constraints. The bus 1120 links together various circuits including one or more processors and/or hardware modules, represented by the modules or circuits 1104, 1106 and 1108, and the computer-readable storage medium 1108.

The processor 1116 is responsible for general processing, including the execution of software, code and/or instructions stored on the computer-readable storage medium 1108. The computer-readable storage medium may include a non-transitory storage medium. The software, when executed by the processor 1116, causes the device 1102 and the processing circuit 1116, in particular, to perform the various functions described herein for any particular apparatus. The computer-readable storage medium 1108 may be used for storing data that is manipulated by the processor 1116 when executing software.

Device 1102 includes at least one of the modules 1104 and 1106. The modules 1104 and 1106 may be software modules running in the processor 1116, resident/stored in the computer-readable storage medium 1108, one or more hardware modules coupled to the processor 1116, or some combination thereof. The modules 1104 and 1106 may include microcontroller instructions, state machine configuration parameters, or some combination thereof. As illustrated, module 1104 may be configured to control the ASDIV switching to effectuate the various ASDIV switching and state as illustrated in FIGS. 3-6 and 8, as examples. Furthermore, the module 1106 may be configured for optimizing the ASDIV switching, such as minimizing the use of longer ASDIV traces. Module 1110 is configured as control logic circuitry for effectuating the protection of various front end components (as well as receive components with modems as well) due to transmissions when utilizing concurrent radio systems, such as WiFi and LAA/eLAA for example. Module 1110 may be configured with FPGAs in order to effect various logic configurations. The computer-readable storage medium 1108 further includes instructions or code stored thereon for causing the processing circuit 1116 and/or modules 1104 and 1106 to implement the various processes of ASDIV switching disclosed herein, as well as to optimize the switching.

Figure 12:
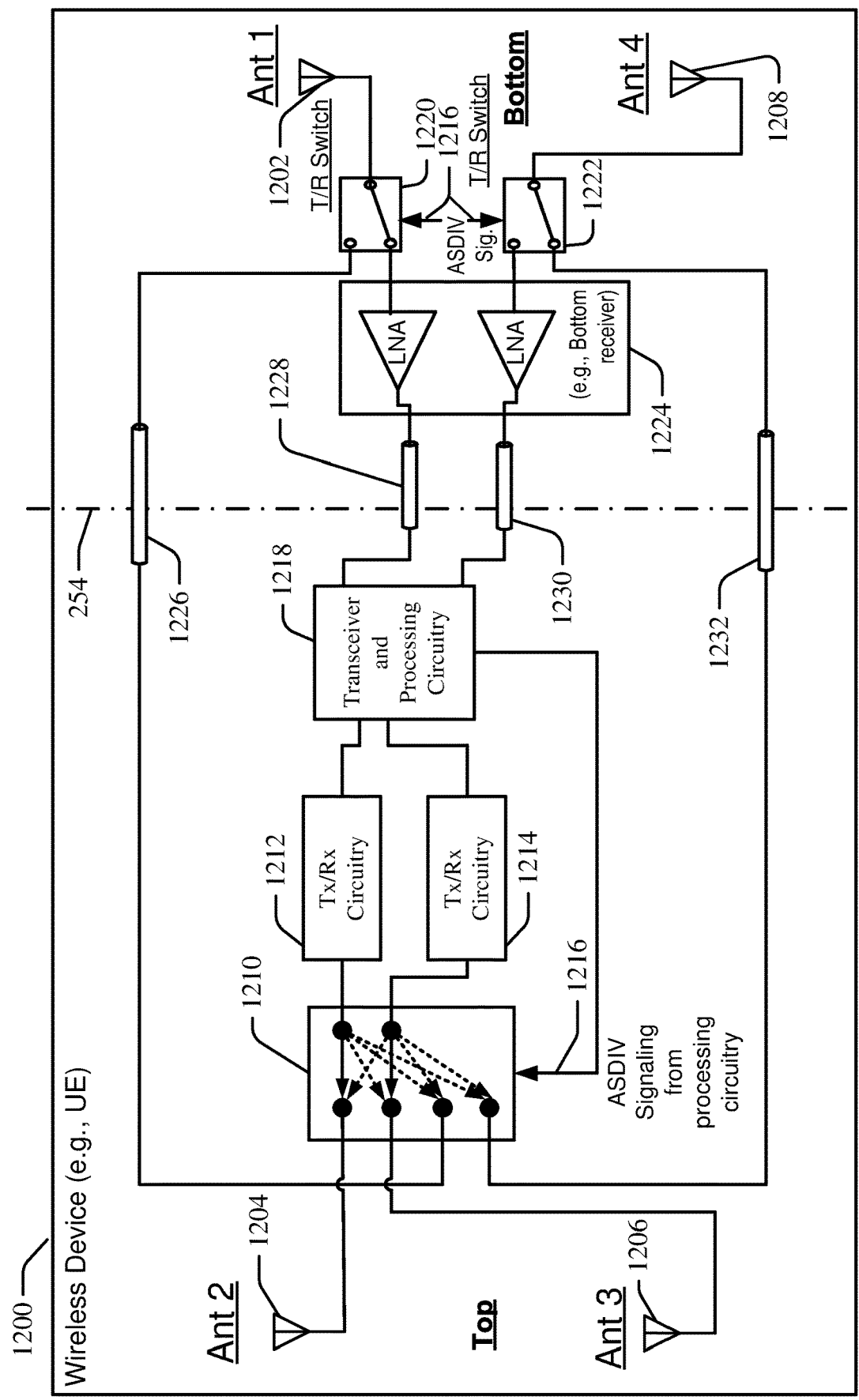
FIG. 12 illustrates yet another exemplary apparatus that may be employed in a wireless device utilizing four antennas in an implementation of ASDIV.

FIG. 12 illustrates yet another exemplary wireless communication apparatus 1200, which may be implemented as a UE, in which the present methods may be employed. In particular, apparatus 1200 is configured to effectuate antenna switch diversity by switching between at least four antennas Ant 1-Ant 4 (labeled 1202, 1204, 1206, and 1208, respectively). In this example, switching may be performed with a four-way switch 1210 that communicatively couples transmit/receive circuitry (Tx/Rx circuitry 1212 and 1214) operable according at least one radio technology to at least two of the four antennas Ant 1-Ant 4. Thus, any of the four extant antennas in this example may be coupled to the Tx/Rx circuitry 1212 and 1214, for either transmit or receive operations. Control of the four-way switch 1210 may be accomplished with an ASDIV signal 1216, which may be supplied by a transceiver and processing circuitry 1218. Additionally, the transceiver and processing circuitry 1218 is coupled to the Tx/Rx circuitry 1212 and 1214 for either supplying signals for transmission or receiving signals received via the antennas Ant 1-Ant 4.

Additionally, in the implementation illustrated in FIG. 12, antennas Ant 1 and Ant 4 (1202 and 1208) may be considered bottom antennas, and antennas Ant 2 and Ant 3 (1204 and 1206) are considered top antennas. Further, the example of FIG. 12 may include additional transmit/receive switches (T/R switches 1220 and 1222) respectively coupled to antennas Ant 1 and Ant 4, as well as the four-way switch 1210. The transmit/receive switches 1220 and 1222 may also be controlled through the ASDIV signaling 1216 from the transceiver and processing circuitry 1218. It should be noted that although the same reference number 1216 is shown to denote the ASDIV signaling, this is not intended to imply or limit that the signaling is the same to all of the switches 1210, 1220, and 1222, and those skilled in the art will appreciate that specific and different signaling may be sent by the transceiver and processing circuitry 1218 to specifically and distinctly control each respective switch.

As further illustrated, the switches 1220 and 1222 are also coupled to a bottom receiver 1224 containing LNAs for receiving and amplifying signals received on antennas Ant 1 and Ant 4 and, in turn, transmitting the signals to the transceiver and processing circuitry 1218. As may be further seen in FIG. 12, the couplings between the four-way switch 1210 and the T/R switches 1220 and 1222 may constitute transmission lines, trances or coaxial cables 1226 and 1232 for transmissions between top to bottom portions of the wireless device 1200. Similarly, the couplings between the bottom receiver 1224 and the transceiver and processing circuitry may constitute transmission lines, trances or coaxial cables 1228 and 1230 for transmissions between top to bottom portions of the wireless device 1200. It is further noted that although this construction is not necessarily illustrated in the examples of FIG. 2, 7, or 9, it is understood that transmission lines or coaxial cables such as 1228, 1230 may be employed in these examples as well between top and bottom portions, even though not explicitly illustrated.

In operation, the device 1200 may couple any two or the four antennas Ant 1-Ant 4 for ASDIV in any of a number of various combinations. The present methods disclosed herein are applicable to device 1200, as will be appreciated by those skilled in the art. Additionally, it is noted that in one aspect, device 1200 may be configured such that the switching may be configured to couple any transmitter to any antenna, but during the receive cycles, the switches will be configured to go switch back to receive ports in the transceiver and processing circuitry 1218 (or Tx/Rx circuitry 1212 or 1214) ports as a default in order to reduce the receiver noise (e.g., reduce the noise figure (NF)).

As will be appreciated by those skilled in the art, the present methods and apparatus also allow the sharing of switches and attendant resources used for implementing ASDIV across at least two different radio systems (e.g., LAA and WiFi). Thus, the apparatus provides for sharing of both antennas and switching resources among two or more different radio systems in a UE or other wireless devices.

Example methods, apparatuses, or articles of manufacture presented herein may be implemented, in whole or in part, for use in or with mobile communication devices. As used herein, "mobile device," "mobile communication device," "hand-held device," "tablets," etc., or the plural form of such terms may be used interchangeably and may refer to any kind of special purpose computing platform or device that may communicate through wireless transmission or receipt of information over suitable communications networks according to one or more communication protocols, and that may from time to time have a position or location that changes. By way of illustration, special purpose mobile communication devices, may include, for example, cellular telephones, satellite telephones, smart telephones, heat map or radio map generation tools or devices, observed signal parameter generation tools or devices, personal digital assistants (PDAs), laptop computers, personal entertainment systems, e-book readers, tablet personal computers (PC), personal audio or video devices, personal navigation units, or the like. It should be appreciated, however, that these are merely illustrative examples relating to mobile devices that may be utilized to facilitate or support one or more processes or operations described herein.

The methodologies described herein may also be implemented in different ways and with different configurations depending upon the particular application. For example, such methodologies may be implemented in hardware, firmware, and/or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other devices units designed to perform the functions described herein, and/or combinations thereof.

Some portions of the preceding detailed description have been presented in terms of algorithms or symbolic representations of operations on binary digital electronic signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involves physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

Unless specifically stated otherwise, as apparent from the following discussion, it is appreciated that throughout this specification discussions utilizing terms such as "processing," "computing," "calculating,", "identifying", "determining", "establishing", "obtaining", and/or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. In the context of this particular patent application, the term "specific apparatus" may include a general purpose computer once it is programmed to perform particular functions pursuant to instructions from program software.

Reference throughout this specification to "one example", "an example", "certain examples", or "exemplary implementation" means that a particular feature, structure, or characteristic described in connection with the feature and/or example may be included in at least one feature and/or example of claimed subject matter. Thus, the appearances of the phrase "in one example", "an example", "in certain examples" or "in some implementations" or other like phrases in various places throughout this specification are not necessarily all referring to the same feature, example, and/or limitation. Furthermore, the particular features, structures, or characteristics may be combined in one or more examples and/or features.

Methods described herein may be implemented in conjunction with various wireless communication networks such as a wireless wide area network (WWAN), a wireless local area network (WLAN), a wireless personal area network (WPAN), and so on. The term "network" and "system" are often used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, and so on. A CDMA network may implement one or more radio access technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth network, an IEEE 802.15x, or some other type of network. The techniques may also be implemented in conjunction with any combination of WWAN, WLAN and/or WPAN. Moreover, several aspects of wireless communication networks such as WLAN and WAN networks, and wireless devices operable therein have been presented with reference to an exemplary implementation. As those skilled in the art will readily appreciate, various aspects described throughout this disclosure may be extended to other telecommunication systems, network architectures and communication standards. By way of example, various aspects may be implemented within other systems defined by 3GPP, such as 5G NR, Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standards, network architectures, and/or communication standards employed will depend on the specific applications and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-12 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-12 may be configured to perform one or more of the methods, features, or steps described herein.

The present description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method for controlling a wireless device having at least one radio frequency (RF) system, the method comprising:
   selecting an antenna for transmission of signals from radio components of the at least one RF system from between a first default antenna that is normally coupled to the radio components of the at least one RF system for transmission of signals and one of a plurality of other antennas in the wireless device;
   configuring one or more switches in the device to couple the radio components to the selected antenna for transmission cycles of the at least one RF system when the radio components are transmitting in an antenna switch diversity (ASDIV) period;
   configuring the one or more switches to couple the radio components to at least the first default antenna for receive cycles of the at least one RF system during the ASDIV period; and
   alternately switching the antenna couplings to the selected antenna during transmit cycles and to the first default antenna during receive cycles of the ASDIV period.

2. The method of claim 1, further comprising:
   configuring the one or more switches to couple the radio components in the wireless device to respective default antennas after a predetermined time or condition for providing antenna switch diversity has ended.

3. The method of claim 1, wherein the at least one RF system is operable according to a time division duplex (TDD) operation.

4. The method of claim 3, wherein the at least one RF system is operable with a Wide Area Network (WAN) according to one or more of LTE-U technology, LTE, Licensed Assist Access (LAA) technology, Ultra-high-band (UHB), enhanced LAA (eLAA) technology, E-UTRA Band 47, 5G New Radio (NR) technology, or a Wireless Local Area Network (WLAN) operable according to WiFi technology.

5. The method of claim 1, wherein the coupling of the radio components is performed with at least one switch device of the one or more switches that is coupled between an antenna and radio components of the at least one RF system.

6. The method of claim 1, wherein selecting the antenna for transmission of signals in the ASDIV period includes selecting an antenna in a different physical location within the wireless device from the physical location of the first default antenna.

7. The method of claim 1, further comprising at least one of:
   switching coupling of the radio components to at least the first default antenna for full 4×4 MIMO operation of the wireless device;
   switching coupling of the radio components to at least the first default antenna for 2×2 MIMO operation of the wireless device; or
   switching coupling of the radio components to at least the first default antenna for High Order Receive Diversity operation.

8. The method of claim 1, wherein the wireless device includes at least first and second concurrent radio systems operable according to a time division duplex (TDD) operation.

9. The method of claim 8, further comprising:
   selectively switching coupling of transmit components of at least the first radio system during transmission cycles of the first radio system and returning the switching to the first default antenna coupling during transmission cycles of at least the second radio system.

10. The method of claim 8, wherein the first and second radio systems utilize frequencies in one of same or different bandwidth of frequencies.

11. The method of claim 8, further comprising:
selectively disabling a low noise amplifier (LNA) of at least the first radio system during transmit cycles of at least the second radio system.

12. The method of claim 8, further comprising:
sharing antennas and switching components between the first and second concurrent radio systems for at least ASDIV operation.

13. The method of claim 1, wherein switching of the coupling of one or more of the plurality of antennas during the ASDIV period includes transmission of Sounding Reference Signals (SRS).

14. A wireless device having at least one radio frequency (RF) system, the wireless device comprising:
a default antenna normally coupled to radio components of the at least one RF system for transmission and reception of signals;
a plurality of other antennas; and
one or more switches configured to couple the radio components to one of the plurality of other antennas during transmission cycles when the radio components are transmitting in an antenna switch diversity (AS-DIV) period and to couple the radio components back to at least the default antenna during receiving cycles, the one or more switches configured to alternately switch the antenna couplings to the one of the plurality of other antennas during transmit cycles and to the default antenna during receive cycles of the ASDIV period.

15. The wireless device of claim 14, further comprising:
at least one processing circuitry configured to:
cause the one or more switches to switch the coupling of radio components in the wireless device to respective default antennas after a predetermined time or condition for providing ASDIV has ended.

16. The wireless device of claim 14, wherein the coupling of the radio components is performed with at least one switch of the one or more switches that is coupled between an antenna and radio components of the at least one RF system.

17. The wireless device of claim 14, wherein the one of the plurality of other antennas are located in a different physical location within the wireless device from the physical location of the default antenna.

18. The wireless device of claim 15, further comprising:
the wireless device including at least first and second concurrent radio systems utilizing similar frequency bands; and
the at least one processing circuitry configured to selectively switch coupling of transmit components of at least the first radio system during transmission cycles of the first radio system and return the ASDIV switching to a default antenna coupling during transmission cycles of at least the second radio system.

19. The wireless device of claim 18, further comprising:
the at least one processing circuitry configured to selectively disable a low noise amplifier (LNA) of at least the first radio system during transmit cycles of at least the second radio system.

20. The wireless device of claim 18, wherein the first and second radio systems utilize frequencies in one of same or different bandwidth of frequencies.

21. The wireless device of claim 18, wherein the wireless device is configured to share antennas and switching components between the first and second concurrent radio systems for at least ASDIV operation.

22. The wireless device of claim 14, wherein switching of the coupling of one or more of the plurality of antennas during the ASDIV period includes transmission of Sounding Reference Signals (SRS).

23. An apparatus operable with at least one RF radio system, the apparatus comprising:
means for selecting an antenna for transmission of signals from radio components of the at least one RF radio system from between a first default antenna that is normally coupled to the radio components of the at least one RF radio system for transmission of signals and one of a plurality of other antennas in the apparatus;
means for configuring one or more switches in the apparatus to couple the radio components to the selected antenna for transmission cycles of the at least one RF radio system when the radio components are transmitting in an antenna switch diversity (ASDIV) period;
means for configuring the one or more switches to couple the radio components to at least the first default antenna for receive cycles of the at least one RF radio system during the ASDIV period; and
means for configuring the one or more switches to couple the radio components in the apparatus to respective default antennas after a predetermined time or condition for providing antenna switch diversity has ended.

24. The apparatus of claim 23, wherein the at least one RF radio system is operable according to a time division duplex (TDD) operation.

25. A non-transitory computer-readable medium storing computer-executable code, comprising code for causing a computer to:
select an antenna for transmission of signals from radio components of at least one RF system from between a first default antenna that is normally coupled to the radio components of the at least one RF system for transmission of signals and one of a plurality of other antennas in a wireless device;
configure one or more switches in the wireless device to couple the radio components to the selected antenna for transmission cycles of the at least one RF system when the radio components are transmitting in an antenna switch diversity (ASDIV) period;
configure the one or more switches to couple the radio components to at least the first default antenna for receive cycles of the at least one RF system during the ASDIV period; and
configure the one or more switches to couple the radio components in the wireless device to respective default antennas after a predetermined time or condition for providing antenna switch diversity has ended.

26. The non-transitory computer-readable medium of claim 25, wherein the at least one RF system is operable according to a time division duplex (TDD) operation.

* * * * *